(12) United States Patent
Lee et al.

(10) Patent No.: US 7,839,717 B2
(45) Date of Patent: Nov. 23, 2010

(54) SEMICONDUCTOR DEVICE WITH REDUCED STANDBY FAILURES

(75) Inventors: Jin-wook Lee, Seoul (KR); Jin-yub Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 149 days.

(21) Appl. No.: 12/235,812

(22) Filed: Sep. 23, 2008

(65) Prior Publication Data

US 2009/0154281 A1 Jun. 18, 2009

(30) Foreign Application Priority Data

Dec. 14, 2007 (KR) .................. 10-2007-0130981

(51) Int. Cl.
*G11C 8/18* (2006.01)
(52) U.S. Cl. .................. 365/233.15; 365/229; 365/226; 365/241; 365/191; 365/189.08
(58) Field of Classification Search ............ 365/233.15, 365/229, 226, 241, 191, 189.08, 233.19
See application file for complete search history.

(56) References Cited

U.S. PATENT DOCUMENTS

| 5,638,330 A | * | 6/1997 | Confalonieri et al. .. 365/189.09 |
| 2008/0045166 A1 | * | 2/2008 | Koch et al. ............... 455/127.5 |

FOREIGN PATENT DOCUMENTS

| JP | 2002133878 A | 5/2002 |
| KR | 100634455 B1 | 10/2006 |
| KR | 100648289 B1 | 11/2006 |
| KR | 100706816 B1 | 4/2007 |

* cited by examiner

*Primary Examiner*—Thong Q Le
(74) *Attorney, Agent, or Firm*—Volentine & Whitt, PLLC

(57) ABSTRACT

A semiconductor memory device includes a cell core storing data, a plurality of peripheral circuit components, collectively driving data to/from the cell core and providing a default state at an output signal state during an initialization process upon power-up, and an initialization circuit detecting a standby mode of operation for the semiconductor memory device, and upon detecting the standby mode controlling operation of the plurality of peripheral circuit components to provide the default state as the signal state during standby mode.

20 Claims, 4 Drawing Sheets

SEMICONDUCTOR DEVICE WITH REDUCED STANDBY FAILURES

CROSS-REFERENCE TO RELATED PATENT APPLICATION

This application claims the benefit of Korean Patent Application No. 10-2007-0130981 filed on Dec. 14, 2007, the subject matter of which is hereby incorporated by reference.

BACKGROUND OF THE INVENTION

1. Field of the Invention

The present invention relates generally to semiconductor devices, and more particularly to semiconductor memory devices having reduced standby failures.

2. Description of the Related Art

Standby failure occurs when current leakage through a current path in an integrated circuit persists following a defined operating mode. Under these circumstances, the current leakage wastes power, which is particularly detrimental to mobile electronics incorporating the semiconductor device, and may be erroneously interrupted as a signal within the semiconductor device.

For example, semiconductor memory devices include a cell core and one or more related peripheral circuits. Common operating modes for contemporary semiconductor memory devices include an active mode and a standby mode. In active mode, data may be written to or read from memory cells in the cell core by controlled operation of the related peripheral circuits. However, in standby mode, the peripheral circuits are specifically disabled in order to reduce power consumption within the semiconductor memory device. Thus, a standby failure occurring in such peripheral circuits defeats, as least in part, the primary purpose of the standby operating mode.

FIG. 1 is a circuit diagram illustrating a relevant portion of a peripheral circuit 100 in a conventional semiconductor memory device. As shown in FIG. 1, peripheral circuit 100 receives a clock signal CLK and a plurality of data signals D0, D1, . . . Dn. During a write operation, the peripheral circuit will drive the plurality of signals onto signal lines connected to memory cells on the cell core of the semiconductor memory device (not shown). In order to drive the plurality of data signals to the cell core, a relatively large number of peripheral circuit components must be used. These components perform various, well-understood functions and may be variously implemented and operated within the semiconductor memory device. Generally speaking, however, many of the peripheral circuit components will include a combination or sequential logic circuit operating in relation to one or more input signals and providing a corresponding output. Many of the peripheral circuit components also include one or more flip-flop circuits.

Referring to the collection of peripheral circuit components 100 shown in FIG. 1, when power is applied to the constituent semiconductor memory device, an initialization process is performed. During the initialization process, defined "set" (SN) and "reset" (RN) are generated upon detection of the applied power. As the set/reset signals are applied to the peripheral circuit components during the initialization process, default state outputs are provided by the peripheral circuit components. A test process may be applied to the semiconductor memory device during a first (or each) initialization process. During the test process, a predetermined data pattern is applied to the collection of peripheral circuit components 100. With the predetermined data pattern applied, the current consumption of the semiconductor memory device is measured and a determination is made regarding whether or not excessive current leakage is present (i.e., whether a standby failure has occurred). However, this static default condition testing is often unable to accurately identify current leakage associated with mode transitions within the semiconductor memory device.

FIG. 2 illustrates one example of current leakage occurring in the peripheral circuit components 100 of FIG. 1 in relation to an operating mode transition. Following a read/write operation performed by the semiconductor memory device, the data output state for the individual peripheral circuit components 110, 120 and 130 will have random values as the semiconductor memory device enters a subsequent standby mode. For example, if an electrical connection exists between the output of a first peripheral circuit component 110 and a first external signal line, a current path may exist, depending on the residual data state apparent at the output (i.e., its residual voltage state as defined by the last read/write operation) and the voltage level apparent on the first external signal line. Current paths formed in the direction of the illustrated arrows shown in FIG. 2 may exist given the respective residual data states of the first, second and third peripheral circuit components 110, 120 and 130. Thus, since a "low" data state (and a corresponding low voltage) is apparent at the output of the NAND gate of the first and third peripheral circuit components 110 and 130, a current path may be formed when the first or third external signal lines is respectively connected to a "high" voltage source. In similar vein, since a "high" data state (and a corresponding high voltage) is apparent at the output of the NOR gate of the second peripheral circuit component 120, a current path may be formed when the second external signal line is connected to a "low" voltage source (i.e., ground).

Thus, even where current leakage in peripheral circuit components is not detected during initialization testing under static default conditions, a standby failure may nonetheless occur when certain residual data values are apparent at the outputs of the peripheral circuit components, when said outputs are connected to external signal lines coincidentally connected to a mismatched power voltage, for example. Under these dynamic, data-sensitive conditions arising from a previously performed active mode operation, a standby failure may arise that consumes excessive power and reduces overall battery life in portable electronics incorporating the semiconductor device.

SUMMARY OF THE INVENTION

Embodiments of the present invention provide a semiconductor device having a reduced occurrence of standby failures.

In one embodiment, the invention provides a semiconductor memory device comprising; a cell core storing data, a plurality of peripheral circuit components, collectively driving data to/from the cell core and providing a default state at an output signal state during an initialization process upon power-up, and an initialization circuit detecting a standby mode of operation for the semiconductor memory device, and upon detecting the standby mode controlling operation of the plurality of peripheral circuit components to provide the default state as the signal state during standby mode.

In another embodiment, the invention provides a semiconductor device comprising; a plurality of logic circuits respectively generating output data in response to control signals provided by an initialization circuit, wherein the control signals provided by the initialization circuit upon power-up detection define a default state for the output data generated by the plurality of logic circuits, and upon detecting a standby state of operation for the semiconductor device, providing control signals from the initialization circuit to again define the default state for the output data generated by the plurality of logic circuits.

DESCRIPTION OF EMBODIMENTS

Figure 1:
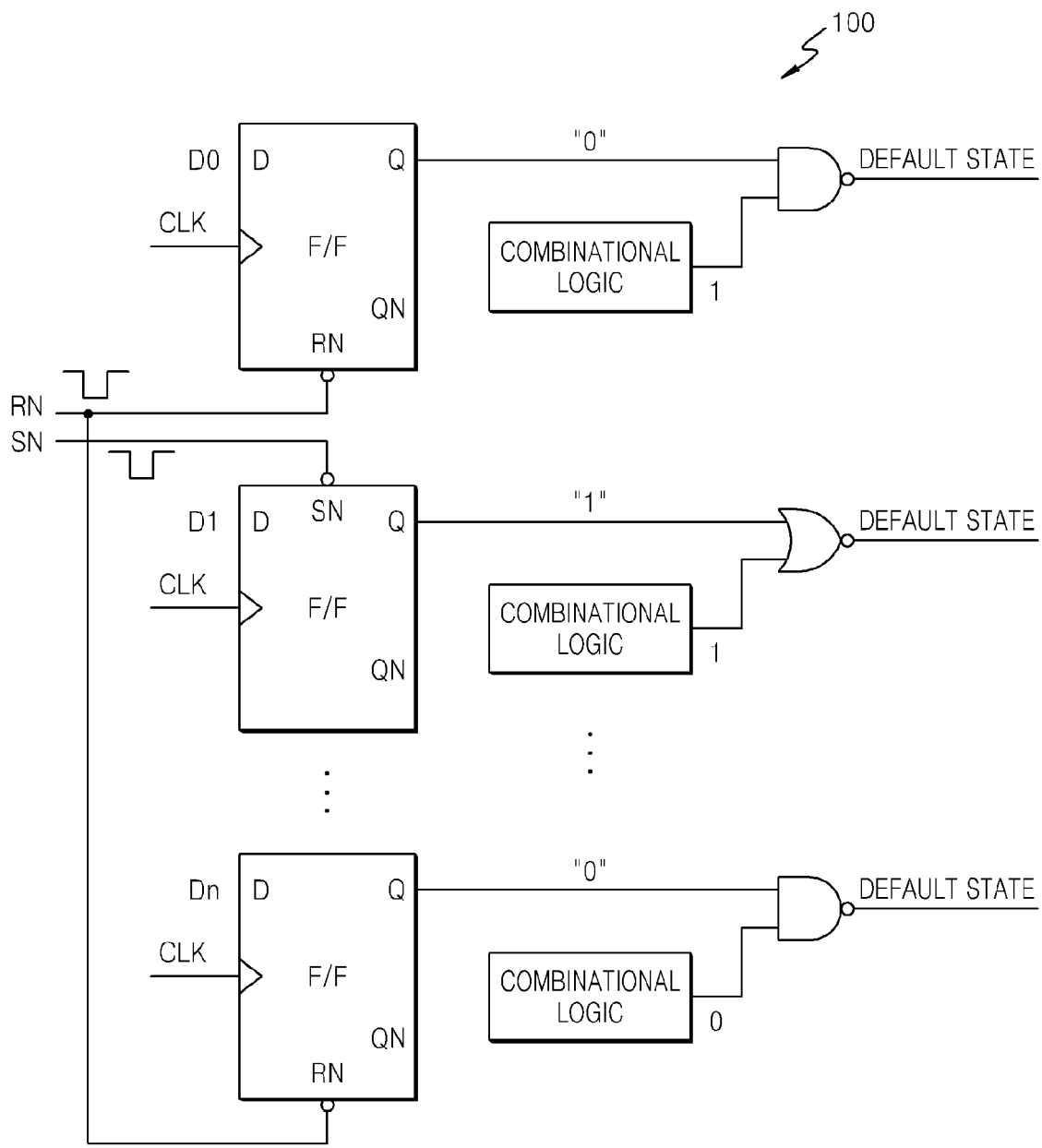
FIG. 1 is a circuit diagram illustrating certain peripheral circuit components within a conventional semiconductor memory device.
Figure 2:
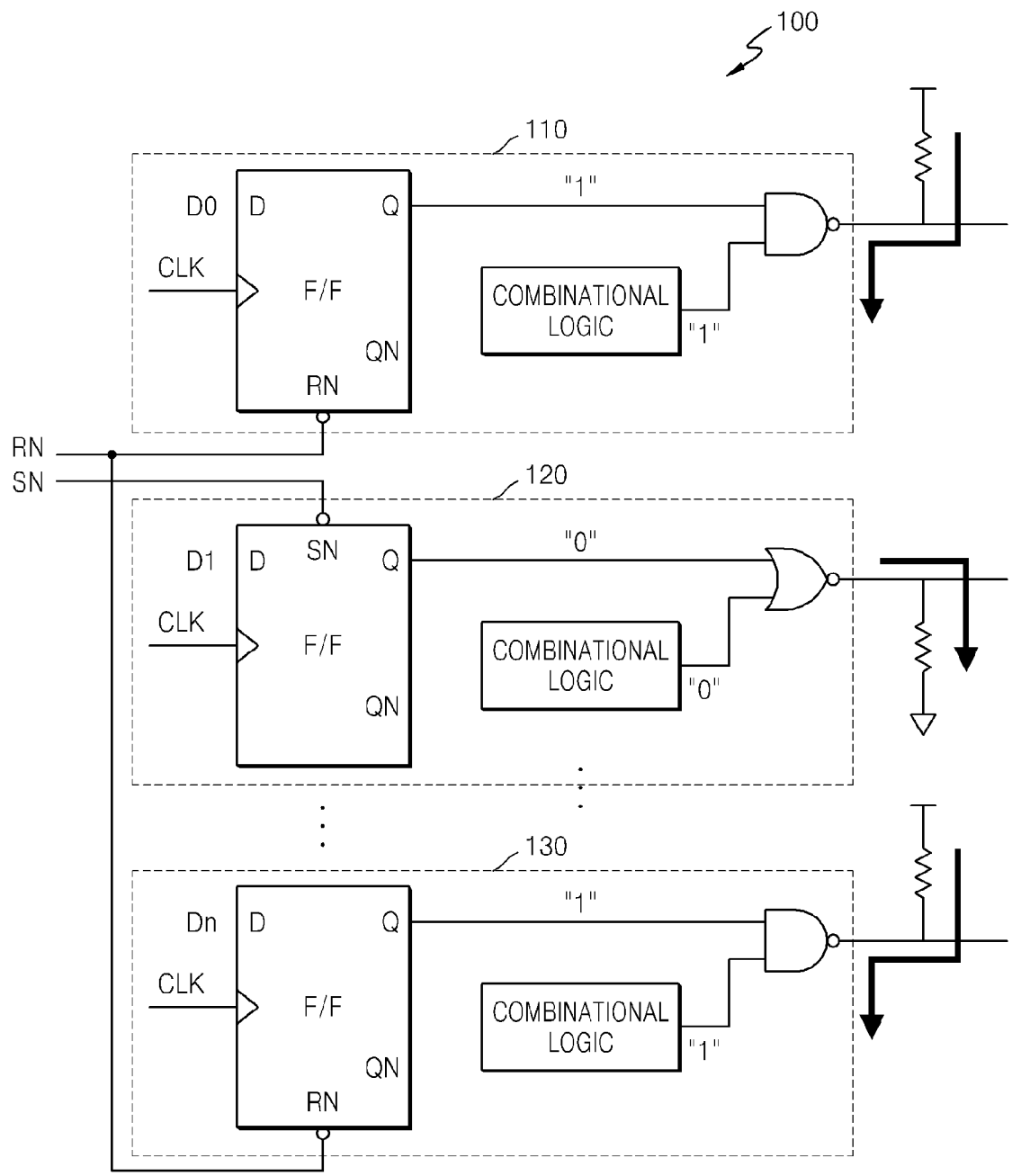
FIG. 2 further illustrates possible current leakage occurring at the peripheral circuit components of FIG. 1.

Several embodiments of the invention will now be described with reference to the accompanying drawings. The invention may however be variously embodied and should not be construed as being limited to only the illustrated embodiments. Throughout the specification like reference numerals and indicators are used to denote like or similar elements.

Figure 3:
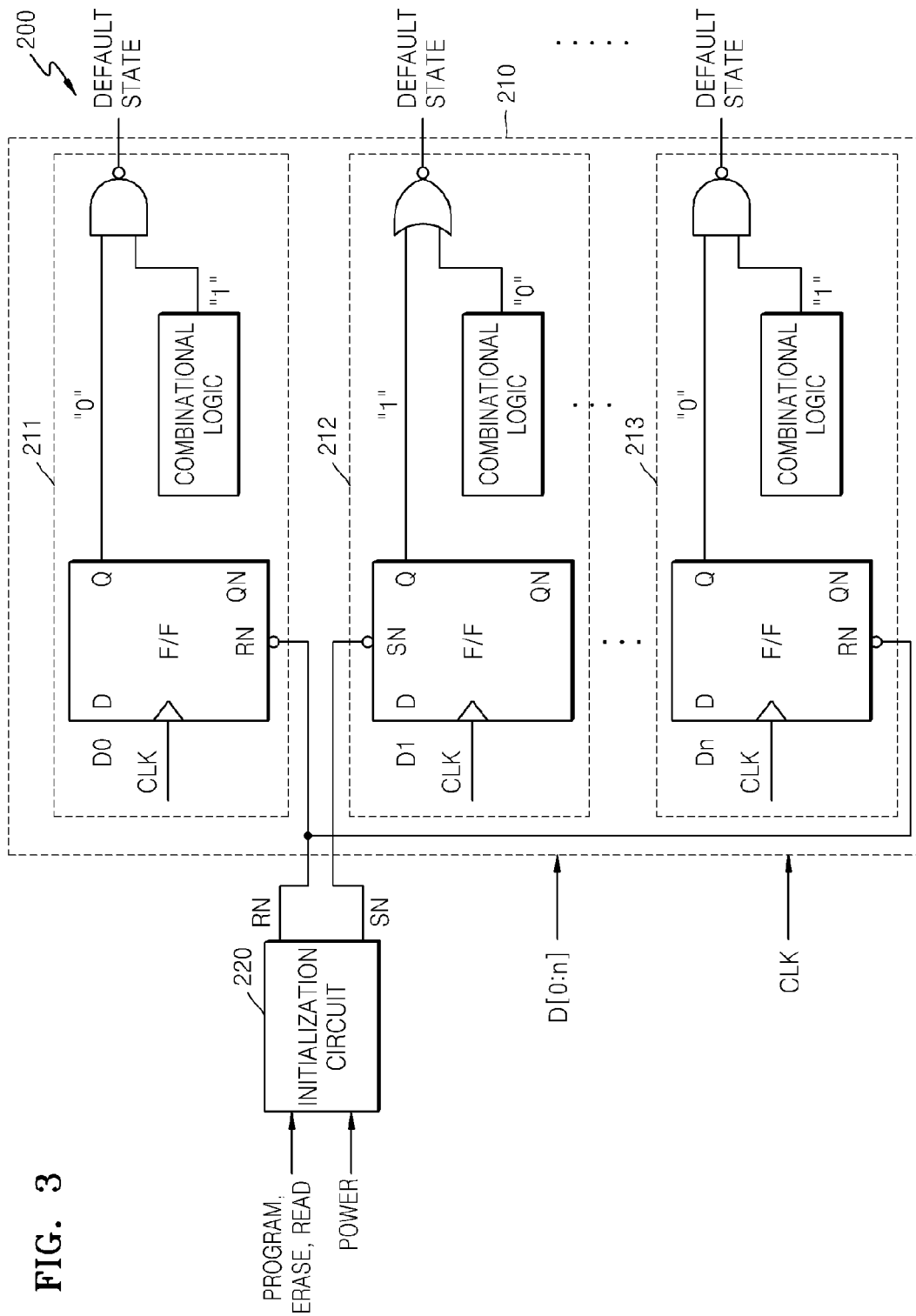
FIG. 3 illustrates an exemplary collection of peripheral circuit components in a semiconductor device according to an embodiment of the invention.

FIG. 3 illustrates an exemplary collection of peripheral circuit components within a semiconductor device according to an embodiment of the invention. The semiconductor device illustrated in FIG. 3 may be, e.g., a semiconductor memory device.

As illustrated in FIG. 3, a semiconductor memory device 200 comprises a plurality of peripheral circuit components 210 respectively generating output data signals that are conventionally driven onto signal lines associated with a cell core (not shown). The small plurality of peripheral circuit components 210 is merely illustrative of a much larger plurality of variously configured peripheral circuit components that will be used in any practical implementation of the present invention. However, in the illustrated example, the plurality of peripheral circuit components 210 receives data signals D[0: n] and a clock signal CLK from an external controller and generates corresponding output data signals subsequently applied to the cell core during (e.g.,) read, write and erase operations.

The plurality of peripheral circuit components 210 is shown with individual circuit components 211, 212 and 213, respectively receiving a first (D0), a second (D1) and an nth (Dn) input data signal at a data input "D" of a flip-flop circuit (F/F). Set (SN) and reset (RN) signals are variously applied to the respective flip-flops, and the clock signal CLK is applied to each clock input of each flip-flop. In response to a particular application of set/reset, clock and data signals, each flip-flop (F/F) generates an output data signal at a data output "Q". The data output signal Q is then applied as an input to combinational and sequential logic circuits to yield a respective data output signal for each peripheral circuit component 211, 212 and 213. Only simple examples of logic circuits (e.g., each flip-flop together with a logic gate receiving an input signal from generically indicated "combination logic") are shown in FIG. 3, but those skilled in the art will understand that such circuitry will vary by input and configuration with design.

Thus, the logic circuitry within each peripheral circuit component 211, 212 and 213 generates output data in synchronization with the applied clock signal CLK, and having a data state determined by the applied input data, reset signal RN and/or set signal SN.

Semiconductor memory device 200 also comprises an initialization circuit 220. When power is applied to semiconductor memory device 200, an initialization process is performed. Initialization circuit 220 detects the application of power to semiconductor memory device 200, and activates the reset signal RN and/or the set signal SN in a defined manner in response to the power detection. Thus, the initialization process is characterized by the selective application of the reset signal RN and/or set signal SN to each peripheral circuit component 211, 212 and 213.

The defined application of the reset signal RN and/or set signal SN to each peripheral circuit component 211, 212 and 213 during the initialization process, results in the generation of respective "default state" outputs by the plurality of peripheral circuit components 210. A leakage current test process may then be applied to semiconductor memory device 200 by applying a predetermined input data pattern to the plurality of peripheral circuit components 210. This type of static leakage current testing is conventional, but will nonetheless reveal certain types of fabrication failures commonly associated with contemporary semiconductor devices.

However, as discussed above, more complete testing is required to ensure the absence of a standby failure. That is, the very precise fabrication processes used to form the very small and very densely integrated elements of contemporary semiconductors may result in standby failures that are not revealed during conventional, static current leakage testing. Some fabrication (or design) failures may actually result in an inadvertent connection (e.g., a conductive bridge) between a peripheral circuit component output and one or more external signal lines. Such inadvertent connections may not be revealed during static current leakage testing, but will nonetheless yield standby failures during dynamic operation of the semiconductor device. That is, the output data value for each component in the plurality of peripheral circuit components 210 may change in relation to various active mode operations (e.g., read/write and erase operations), and different output data values and standby current leakage, as has been seen above, is often a function of output data value in relation to the voltage applied to the bridge-connected external signal line. The term "external signal line" in this context refers to any electrically conductive element outside a peripheral circuit component.

To reduce the incidence of standby failures, initialization circuit 220 provided in semiconductor memory device 200 according to embodiments of the invention is adapted to detect various operating modes for semiconductor memory device 200, and change the output data value for each peripheral circuit component 211, 212, and 213 in relation to the detected operating mode. Initialization circuit 220 may be adapted to detect one or more operating modes, such as a write (or program) operation, a read operation, and/or an erase operation or another type of active mode or a standby mode associated with a particular type of semiconductor memory device 200.

If the detection result indicates a standby mode, the data output values for the plurality of peripheral circuit components 210 is defined such that current leakage does not occur. For example, initialization circuit 220 may activate/deactivate the reset signal RN and/or the set signal SN applied to the plurality of peripheral circuit components in accordance with the detected operating mode, such that the data output values provided by the plurality of peripheral circuit components 210 is identical to that of the default state established during the initialization process.

Figure 4:
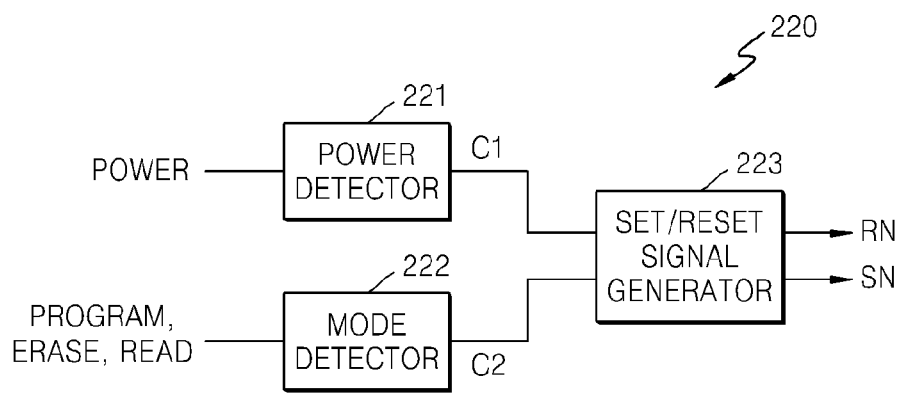
FIG. 4 is a block diagram further illustrating the initialization circuit of the semiconductor device shown in FIG. 3.

FIG. 4 is a block diagram further illustrating one example of initialization circuit 220 shown in FIG. 3. As shown in FIG. 4, initialization circuit 220 comprises a power detector 221 and an operating mode detector 222. To control the output data values provided by the plurality of peripheral circuit components 210 in accordance with the detection results of initialization circuit 220, initialization circuit 220 may further comprise a set/reset signal generator 223 activating/deactivating the reset signal and/or the set signal provided to the plurality of peripheral circuit components 210.

Power detector 221 detects power initially applied to semiconductor memory device 200, generates a first control signal C1 in accordance with the detection result, and provides the first control signal C1 to set/reset signal generator 223. Operating mode detector 222 detects whether the current operating mode of semiconductor memory device 200 is a standby mode by, for example, tracking the completion of one or more active operating modes (e.g., write/program, read and erase operations) within semiconductor memory device 200. Based on a detection of the current operating mode, mode detector 222 generates a second control signal C2, and provides the second control signal C2 to set/reset signal generator 223.

Set/reset signal generator 223 activates/deactivates the set SN and reset RN signals in response to the first and second control signals C1 and C2. Although set and reset signals applied to flip-flop circuits have been described in the foregoing example, other control signals and/or particular logic circuit inputs may be used in other embodiments of the invention. That is, when initial power is applied to semiconductor memory device 200, set/reset signal generator 223 provides the reset signal RN or the set signal SN to each peripheral circuit component 211, 212 and 213, such that the output state of the plurality of peripheral circuit components 210 becomes the default state. In one embodiment of the invention, it is assumed that the reset signal RN and set signal SN are deactivated during active operating modes, during which data is written to or read from the cell core of semiconductor memory device 200. In contrast, when semiconductor memory device 200 operates in standby mode, set/reset signal generator 223 activates the reset signal RN and/or the set signal SN, such that the output data values provided by the plurality of peripheral circuit components 210 assumes the default state (i.e., the same state as was assumed during initialization testing). In this manner, semiconductor memory device 200 runs in standby mode with output data values similar to the output data values defined during initialization testing. Thus, the initialization testing accurately reflects the current leakage occurring during the standby mode of operation. And since the output data values are "don't care" values during the standby mode, no adverse data effects will arise in semiconductor memory device 200.

In the foregoing description, the output data values (or output state) for the plurality of peripheral circuit components 210 is changed to a defined default state associated with an initialization testing process when semiconductor memory device 200 is in a standby mode. However, the scope of present invention is not limited to only this specific approach. For example, the output state of the plurality of peripheral circuit components 210 during the standby mode may be defined to be a specific data pattern that prevents current leakage. A circuit to implement this particular adaptation of the invention may be easily realized by those skilled in the art in view of the foregoing disclosure.

Figure 5:
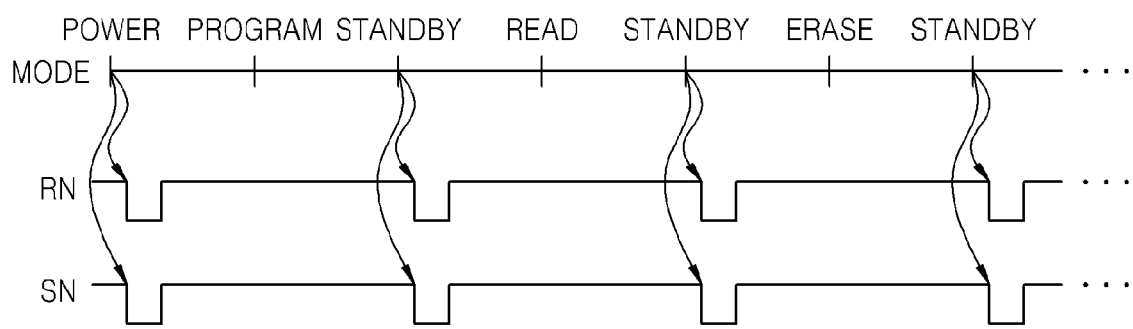
FIG. 5 is a waveform diagram illustrating operation of a semiconductor device according to an embodiment of the invention.

FIG. 5 is a waveform diagram describing overall operation of a semiconductor memory device according to an embodiment of the present invention.

As illustrated, the application of power to the semiconductor memory device is detected, and corresponding peripheral circuits driving data to/from the cell core are initialized. That is, once power-up is detected, a reset signal RN and/or a set signal SN is activated and provided to at least one of a plurality of peripheral circuit components. In response, the output signal state of the plurality of peripheral circuit components becomes a default state.

When data and clock signals are provided to the plurality of peripheral circuit components during an active mode of the semiconductor memory device, an operation driving data to/from the cell core may be performed. Following such operations, the semiconductor memory device may assume a standby mode. When the standby mode is detected, the reset signal RN and/or the set signal SN are again activated/deactivated in a manner such that the signal state of the plurality of peripheral circuits in the standby mode becomes the default state. Accordingly, standby failure of the semiconductor memory device is effectively prevented or significantly reduced in occurrence.

In the above description, the semiconductor memory device is mainly described. However, the present invention is not limited thereto, and embodiments of the invention may be applicable to many types of semiconductor devices, not just memory devices. That is, many semiconductor devices include a plurality of logic circuit blocks that implement a defined function. A reset signal and/or a set signal are applied to one or more of these logic circuit blocks when power is first applied to the semiconductor device during an initialization to define a default state, and thereafter certain standby modes of operation are detected and said logic circuit blocks are operated to assume the same default state.

While the present invention has been particularly shown and described with reference to exemplary embodiments thereof, it will be understood by those of ordinary skill in the art that various changes in form and details may be made therein without departing from the scope of the present invention as defined by the following claims.

What is claimed is:

1. A semiconductor memory device comprising:
   a cell core storing data;
   a plurality of peripheral circuit components, collectively providing a driving signal as an output state for driving data to/from the cell core during an active mode and providing a default state as the output signal state during an initialization process upon power-up; and
   an initialization circuit detecting a standby mode of operation for the semiconductor memory device, and upon detecting the standby mode controlling the output signal state of the plurality of peripheral circuit components, such that the driving signal is changed to the default state during the standby mode.

2. The semiconductor memory device of claim 1, wherein the initialization circuit activates/deactivates at least one of a reset signal and a set signal in response to detection of the standby mode, and provides the at least one activated/deactivated reset signal and set signal to at least one of the plurality of peripheral circuit components.

3. The semiconductor memory device of claim 2, wherein the initialization circuit detects the standby mode from among active operations including a write operation, a program operation, a read operation, and an erase operation.

4. The semiconductor memory device of claim 3, wherein the initialization circuit detects the standby mode following execution of at least one active operation.

5. The semiconductor memory device of claim 3, wherein the initialization circuit further detects power-up for the semiconductor memory device, and activates/deactivates at least one of the reset signal and set signal in response to the power-up detection.

6. The semiconductor memory device of claim 1, wherein the initialization circuit comprises:
   a mode detector detecting a mode of operation for the semiconductor memory device; and
   a set/reset signal generator activating at least one of the reset signal and set signal in response to detection of the standby mode, and providing the at least one activated/deactivated reset signal and set signal to at least one of the plurality of peripheral circuit components.

7. The semiconductor memory device of claim 6, wherein the mode detector detects the standby mode from among active operations including a write operation, a program operation, a read operation, and an erase operation.

8. The semiconductor memory device of claim 7, wherein the set/reset signal generator activates at least one reset signal and set signal following execution of at least one active operation.

9. The semiconductor memory device of claim 6, wherein the initialization circuit further comprises a power detector detecting power-up of the semiconductor memory device and providing a power-up detection result to the set/reset signal generator.

10. The semiconductor memory device of claim 2, wherein each one of the plurality of peripheral circuit components comprises an output circuit responsive to the at least one reset signal and set signal to provide an output data signal.

11. The semiconductor memory device of claim 10, wherein a signal state of the output circuit is the default state upon detection of power-up or detection of the standby mode.

12. A semiconductor device comprising:
   a plurality of logic circuits respectively generating output data having a normal state during an active mode and output data having a default state during an initialization mode in response to control signals;
   an initialization circuit generating and providing the control signals to the plurality of logic circuits during at least one of the initialization mode and a standby mode;
   wherein the control signals provided by the initialization circuit upon detecting a power-up define the default state for the output data, and upon detecting the standby mode the control signals cause the normal state output data to change to the default state output data.

13. The semiconductor device of claim 1, wherein the initialization circuit comprises:
   a mode detector detecting a mode of operation for the semiconductor device; and
   a set/reset signal generator activating at least one of the reset signal and set signal in response to detection of the standby mode, and providing at least one of activated/deactivated reset signal and set signal to at least one of the plurality of logic circuits.

14. The semiconductor device of claim 13, wherein the mode detector detects the standby mode from among active operations.

15. The semiconductor memory device of claim 12, wherein each one of the plurality of logic circuits comprises an output circuit responsive to the at least one reset signal and set signal to provide an output data signal.

16. The semiconductor device of claim 15, wherein a signal state of the output circuit is the default state upon detection of power-up or detection of the standby mode.

17. The semiconductor device of claim 12, wherein the initialization circuit activates/deactivates at least one of a reset signal and a set signal in response to detection of the standby mode, and provides the at least one activated/deactivated reset signal and set signal to at least one of the plurality of logic circuits.

18. The semiconductor device of claim 17, wherein the initialization circuit detects the standby mode from among active modes of operation.

19. The semiconductor device of claim 18, wherein the initialization circuit detects the standby mode following execution of at least one active operation.

20. The semiconductor device of claim 18, wherein the initialization circuit detects power-up for the semiconductor device and activates/deactivates at least one of the reset signal and set signal in response to the power-up detection.

* * * * *